US006609067B2

(12) United States Patent
Tare et al.

(10) Patent No.: US 6,609,067 B2
(45) Date of Patent: Aug. 19, 2003

(54) REAL-TIME METHOD FOR MAINTAINING FORMATION STABILITY AND MONITORING FLUID-FORMATION INTERACTION

(75) Inventors: Uday Arun Tare, Houston, TX (US); Fersheed Khodadad Mody, Houston, TX (US); Ali I. Mese, Houston, TX (US); Di Jiao, Katy, TX (US); Mustafa Hakimuddin, Houston, TX (US)

(73) Assignee: Halliburton Energy Services, Inc., Duncan, OK (US)

( * ) Notice: Subject to any disclaimer, the term of this patent is extended or adjusted under 35 U.S.C. 154(b) by 0 days.

(21) Appl. No.: 09/874,806

(22) Filed: Jun. 5, 2001

(65) Prior Publication Data

US 2002/0010548 A1 Jan. 24, 2002

Related U.S. Application Data

(60) Provisional application No. 60/209,488, filed on Jun. 6, 2000.

(51) Int. Cl.$^7$ .............................................. G01V 11/00

(52) U.S. Cl. ........................................................ 702/9

(58) Field of Search ................................ 702/9, 11, 12, 702/13, 6, 7

(56) References Cited

U.S. PATENT DOCUMENTS

| 4,710,906 | A | 12/1987 | Bradley et al. ................. 367/35 |
| 5,285,692 | A | 2/1994 | Steiger et al. ................. 73/866 |

FOREIGN PATENT DOCUMENTS

| EP | 0 881 357 A2 | 12/1998 | ........... E21B/44/00 |
| WO | WO 99/00575 | 1/1999 | |
| WO | WO 01/25823 A1 | 4/2001 | ........... G01V/11/00 |

OTHER PUBLICATIONS

Mody, F. K. and Hale, A.H.: "A Borehole Stability Model to Couple the Mechanics and Chemistry of Drilling Fluid Shale Interaction", papr SPE/IADC 25728, presented at the 1993 SPE/IADC Drilling Conference held in Amsterdam, Feb. 23–25 1993, pp. 473–490.

Tare, U.A., Mese, A. I., and Mody, F. K.: "Interpretation and Application of Acoustic and Transient Pressure Response to Enhance Shale (In) Stabiity Predictions", paper SPE 63052, presented at the 2000 SPE Annual Technical Conference and Exhibition in Dallas, Texas, Oct. 1–4, 2000, pp. 1–9.

Tare, U. A. and Mody, F. K.: "Novel Approach to Borehole Stability Modeling for ERD and Deepwater Drilling", paper SPE 52188, 1999 SPE Mid–Continent Operations Symposium, Oklahoma City, USA Mar. 28–31, 1999, pp. 1–9.

(List continued on next page.)

Primary Examiner—Donald E. McElheny, Jr.
(74) Attorney, Agent, or Firm—Craig W. Roddy; Karen B. Tripp

(57) ABSTRACT

A real-time method is disclosed for maintaining subterranean formation stability through monitoring the interaction between the formation and fluids introduced into (or produced from ) a wellbore penetrating the formation. The method employs real-time wellbore (in)stability logging methodology. The method is exemplified by a Pore Pressure Transmission (PPT) test. In such test, test fluids are exposed to Pierre II shales (20% w/w NaCl solution and sodium silicate fluid with 20% w/w NaCl, for example) in a PPT apparatus. Membrane efficiency of the two fluids when exposed to the outcrop shale is calculated, and based on the simultaneous acquisition of acoustic data, estimation of a dynamic rock property is made. Calibrating representative shale (or other formation) core response to drilling fluids (or well service fluids, enhanced recovery fluids, or production fluids) under realistic in-situ conditions aids in accurately modeling for time-dependent formation (in)stability in the field for the entire life of the wellbore, from drilling, completion and through production.

14 Claims, 15 Drawing Sheets

OTHER PUBLICATIONS

Tan, C. P., Rahman, S. S., Richards, B. G., and Mody, F. K.: "Integrated Rock Mechanics and Drilling Fluid Design Approach to Manage Shale Instability", paper SPE 47259, SPE/ISRM Eurock '98, Trondheim, Norway, Jul. 8–10, 1998, pp. 291–300.

Ghassemi, A., Diek, A., and Roegiers, J. C.: "A Solution for Stress Distribtuion Around an Inclined Borehole in Shale", paper No. 043, Int. J. Rock Mech. Min. Sci., vol. 35 No. 4/5. p. 538–540, 1998.

Staverman, A. J.: "Theory of Measurement of Osmotic Pressure", Recueil des Travaux Chimiques des Pays–Bas, v. 70, pp 344–352, (1951).

Bradley, W. B.: "Failure of Inclined Boreholes", J. Energy Res. Tech. (Dec. 1979) 232: Trans., AIME, 101, pp. 1–9.

Mody, F. K., Tare, U. A., and Kirsner, J.: "Silicate–Based Drilling FLuids—A Unique High Membrane Efficient WBM that Provides Shale Protection Mechanism", paper PP# N128 Colaper XI—Argentina 98, XI Congresso Lationamericano De Perforacion, Buenos Aires, Argentina, Oct. 98.

Y. Abousleiman;, S. Ekbote; L. Cui; F. Mody; J.C. Roegiers; and M. Zaman; Time–Dependent Coupled Processes in Wellbore Design and Stability, SPE 56759; presented at the 1999 SPE Annual Technical Conference and Exhibition held in Houston, Texas Oct. 3–6, 1999.

REAL-TIME METHOD FOR MAINTAINING FORMATION STABILITY AND MONITORING FLUID-FORMATION INTERACTION

RELATED APPLICATION

This application claims priority to U.S. Provisional Patent Application No. 60/209,488, filed Jun. 6, 2000.

BACKGROUND OF THE INVENTION

1. Field of the Invention

This invention relates to methods for predicting and maintaining wellbore stability during drilling, well servicing and production in subterranean formations, particularly hydrocarbon bearing subterranean formations.

2. Description of Relevant Art

As used herein, the term "(in)stability" shall be understood to mean "stability or instability." Wellbore (in)stability in shales is a major problem costing the petroleum industry, according to conservative estimates, $700 million annually. Understanding and modeling mechanisms of shale (in)stability is an ongoing industry effort. Drilling a hole into a formation in equilibrium induces stress concentration in the vicinity of the borehole. Interactions will occur if parameters such as chemical potential, electrical potential, thermal potential, ionic concentration, etc., of the drilling fluid and the shale formation fluid are not in equilibrium. Any differences in these parameters will alter the near wellbore pore pressure which in turn will influence the borehole equivalent stress-state and the shale mechanical strength thus affecting wellbore (in)stability. Tests conducted at compressive uniaxial and triaxial stress conditions in the past have indicated the strong influence of these parameters on shale strength.

Wellbore instability predominantly occurs in chemically reactive shales that overlay reservoirs. A major concern of the drilling engineer is either keeping the borehole wall from collapsing (packing off) or fracturing (losing circulation).

Past efforts to develop improved well bore models ("WBM") for shale drilling have been hampered by a limited understanding of the drilling fluid/shale interaction phenomenon. This limited understanding has resulted in drilling fluids being designed with properties inadequately or insufficiently optimized to prevent the onset of borehole (in)stability problems. Historically, wellbore (in)stability problems have been approached on a trial-and-error basis, going through a costly multi-well learning curve before arriving at reasonable solutions for optimized operations and systems.

Recent studies of fluid-shale interactions have produced fresh insights into the underlying causes of borehole (in)stability; and chemical potential related instabilities in shales have been identified. A chemical potential borehole stability model, derived for an arbitrary borehole orientation, has been successfully implemented to address borehole (in)stabilities. This model, based on a well-established elastic modeling approach, is discussed in Tare, U. A., and Mody, F. K.: "Novel Approach to Borehole Stability Modeling for ERD and Deepwater Drilling", paper SPE 52188, 1999 SPE Mid-Continent Operations Symposium, Oklahoma City, USA, Mar. 28–31, 1999, incorporated herein by reference.

Advances in technology are providing wider and greater capabilities for new, more reliable, accurate and rugged downhole sensors and tools. Such apparatuses and sensors are increasingly able to collect and transmit information to the surface as it is happening.

With increasing economic demands on reducing rig downtimes associated with borehole instability problems, there is increasing need for the ability to predict and resolve instabilities in the field using MWD/LWD (measuring while drilling/logging while drilling) data in conjunction with prior geophysical and shale/fluid interaction knowledge. However, previous attempts have focused on earth stresses, using drilling data and borehole (in)stability modeling on a "post-mortem" basis, i.e., after substantial problems have occurred. There is a need for methods that enable instability problems to be avoided.

SUMMARY OF THE INVENTION

A method is disclosed for maintaining subterranean formation stability, and particularly wellbore stability during drilling, well completion and servicing operations, and even during production and enhanced recovery operations. The method of the invention affords maintenance of wellbore stability throughout the life of a well penetrating a subterranean formation. Moreover, the method provides for real-time monitoring of fluid-formation interaction such that adjustments can be made before (in)stability problems occur.

In the method, initial formation characteristics or parameters are estimated or obtained and the rock strength of the formation is estimated. Characteristics of the fluids injected into the wellbore or the formation during drilling, or during well completion and servicing operations, or during production or enhanced recovery operations, are also estimated or obtained. This data concerning the formation and the fluids is input into a well-stability model and results are used to revise the estimates of the formation parameters and/or the fluid parameters or to adjust the fluid composition or characteristics. These parameters and the model results are updated with real time formation measurements taken during the particular operation being conducted (i.e., drilling, well servicing, or production). Continued acquisition and processing of the formation data in the model allows the fluids to be adjusted as needed to avoid formation instability problems caused by interaction of the fluids with the formation.

DETAILED DESCRIPTION OF PREFERRED EMBODIMENTS

Figure 1A:
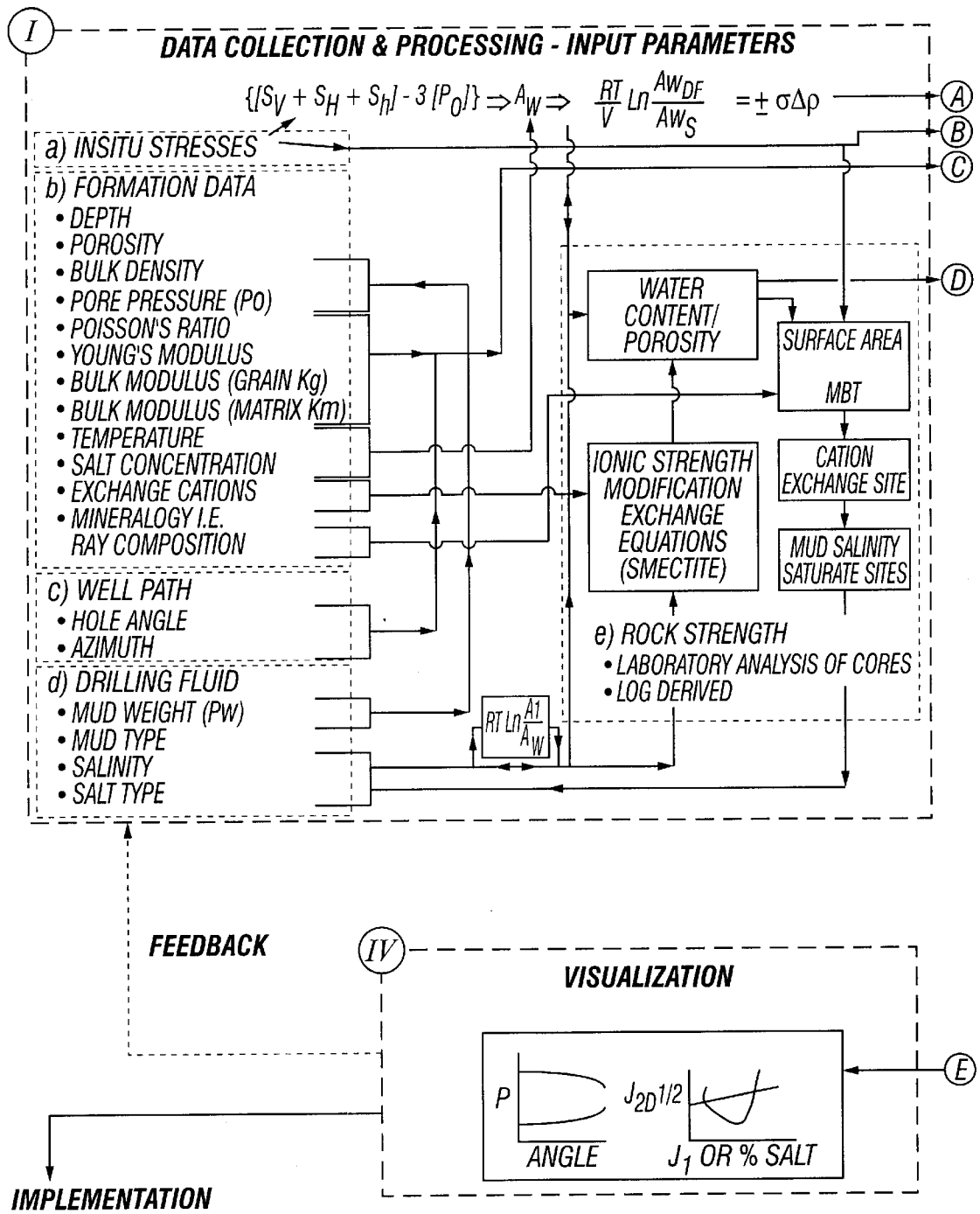
FIGS. 1A and 1B are a flowchart or process map for a real-time wellbore stability process according to the invention.

The following terms as used herein, and particularly as used in the figures, have the meaning indicated below:

Nomenclature $\sigma$=Membrane efficiency, %
P=Pressure, $m/Lt^2$, psi
E=Young's modulusm $m/Lt^2$, psi
Aw=Water activity
$\Delta P$=Pressure drop, $m/Lt^2$, psi
V=Acoustic Velocity, m/t, m/sec

Subscripts ic=confining
o=external or pore fluid
fl=test fluid
sh=shale fluid
exp=experimental
p=sonic compressional waves
s=sonic shear waves

SI Metric Conversion Factors ft×3.048 E−01=m
in.×2.54 E+00=cm
lbf×4.448 222 E+00=N
psi×6.894 757 E+00=kPa In investigating the role of various potentials of drilling fluids on transient rock properties of shale and other subterranean formations subjected to compressive confining stress, we have discovered that properties of cores from such formations should be measured as a function of time when exposed to a drilling fluid, well service fluid, or enhanced production fluid, or even when subjected to production itself Experiments were conducted under conditions simulating a borehole portion under geostatic stress with the wellbore surface exposed to a circulating drilling fluid. The results supported our discovery.

In the experiments, rock properties such as acoustic velocity and transient pressure for each core sample were measured simultaneously as a function of time during the experiments. This simultaneous measurement eliminated the anisotropy-associated differences obtained when different samples are used to determine the relationship between these characteristic parameters of the subterranean formations, and in these experiments, particularly the characteristic parameters of the shale formations. This testing enhanced understanding of the relationship between acoustical, mechanical, chemical, electrical and failure properties of the shale as a function of time when exposed to a fluid, and in these experiments, particularly when exposed to a drilling fluid. Such measurements provide the necessary precursor to determine the onset of time dependent in(in)stability, thus providing options to implement corrective measures in real time to alleviate (in)stability, according to the method of the present invention.

Without wishing to be limited by theory, we believe, based on our observations from these above experiments, that measurement of rock properties such as acoustic velocity as a function of the transient pressure of shales under simulated in-situ stress-state facilitates real time wellbore (in)stability logging using MWD/LWD or any other relevant information. This practice provides better real-time management of(in)stability problems in the field.

The present invention provides a method or process for maintaining formation stability through monitoring the interaction between the formation and fluids used in well drilling, servicing or production. Further, the present invention provides a real-time method for improved drilling, servicing and producing wellbore in or through subterranean formations by employing such monitoring and maintaining of well stability. The improvements of the invention are especially appreciated in operations in shale formations, although the invention is applicable as well to other types of subterranean formations. Similarly, the improvements of the invention are especially appreciated in drilling through subterranean formations, although the invention is applicable as well to other operations in subterranean formations, such as well completion and well servicing operations, and even to producing operations. Thus, the advantages of the invention are best realized when the invention is applied throughout the life of a wellbore in a subterranean formation, and especially a hydrocarbon bearing subterranean formation.

Figure 1B:
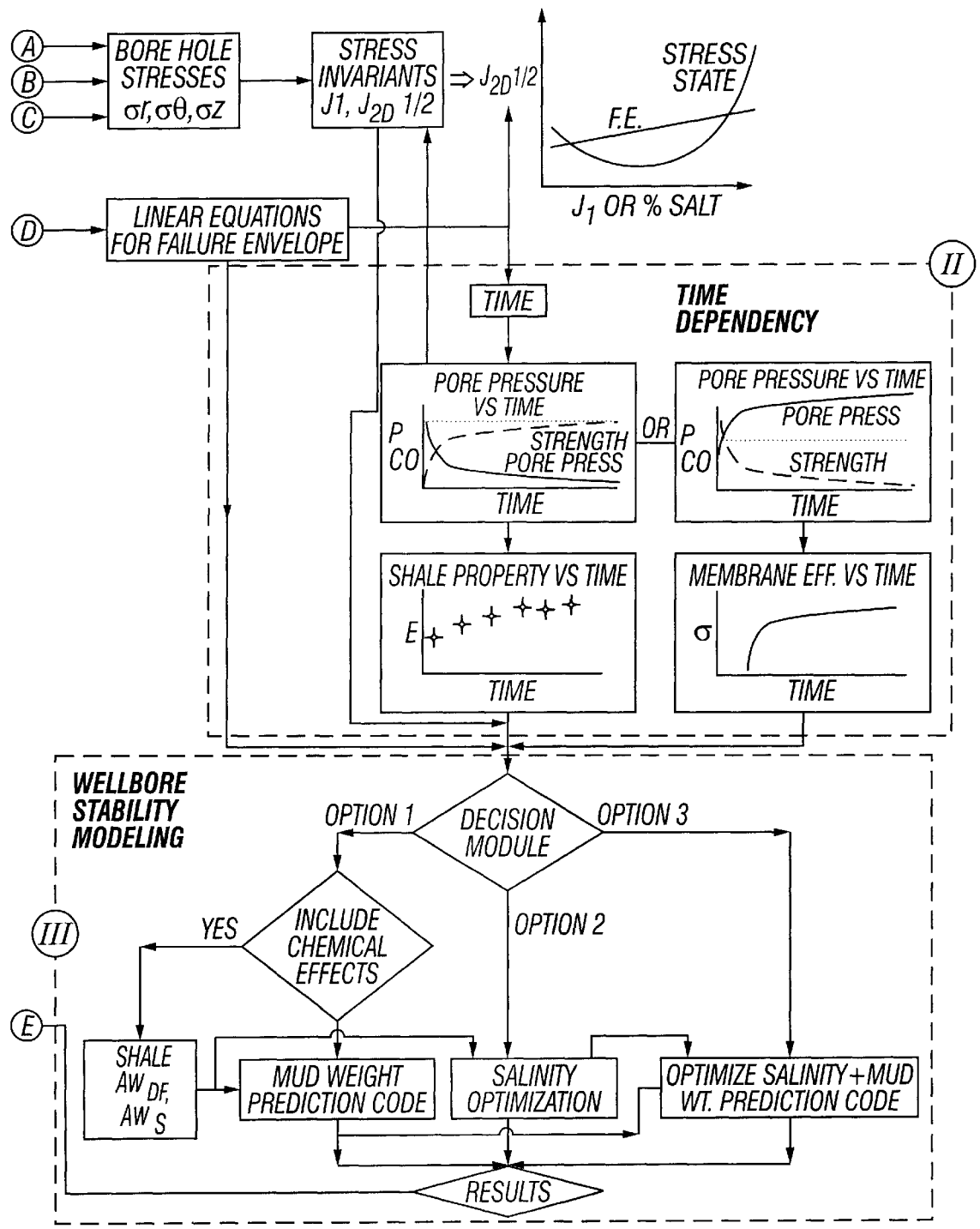

The method of the invention employs real-time wellbore stability modeling. FIGS. 1A and 1B present a process map of real-time wellbore stability modeling, specifically for example as applied to drilling operations. A similar map would be used for well completion or other service operations employing well service fluids instead of drilling fluids. Also, a similar map would be used for well production operations, monitoring stability of a well as fluids may be produced from a formation, and monitoring stability of a well during various enhanced recovery operations (for enhancing recovery of hydrocarbons from the formation). In all such cases, the interaction of the formation to various fluids being introduced into or being produced from the wellbore are monitored. Hereinafter, the description of the invention will primarily be directed to drilling operations and to drilling fluids for example. However, the invention is not limited to such operations or fluids and may be similarly applied to well completion and service operations involving well service fluids and to production operations.

The initial step in the method or process of the invention involves constructing an earth-model (preferably including stresses, formation compressive and tensile strengths and geologic features) from a variety of sources such as pre-drill, seismic, and offset data. Based on the initial earth-model, predictions are made for mud weights, casing shoe locations, drilling fluid type and chemistry, etc. as would be known to those skilled in the art. Preferably simultaneously, laboratory tests are conducted for specific formations (e.g., shales) that are expected to be drilled, using either actual cores from such formations or representative outcrop samples. The tests are conducted using a variety of experimental apparatuses such as the Pore Pressure Transmission (PPT) test apparatus. Information on time-dependent formation (e.g., shale) behavior is obtained from such tests.

Further in the method of this invention, rock properties such as transient pore pressure, compressional and shear wave velocities, deformation, and strength of shale cores under triaxial stress are measured. These measurements are used to calibrate the wellbore stability model (also called the total potential model), such as the model shown in the flow diagrams in FIG. 1B, for specific applications, such as, for example, drilling with programmed or planned drilling fluids through/into a reservoir overlaying shales or other formations of interest. Measurements of static and dynamic rock properties as a function of the transient pressure of shales (or other formations of interest) under triaxial stress state enhances understanding of the relationship between these parameters. Such measurements also help in determining how economically to obtain these properties using MWD/LWD (measurement while drilling/logging while drilling) data.

During the drilling process, the earth-model and the total potential wellbore stability model are updated with real-time measurements while drilling (MWD) and/or using wireline logs or any other techniques for determining static and dynamic rock properties. The captured MWD and/or wireline data or data obtained from any other techniques is processed in real-time and this data is converted into input parameters for the wellbore stability model. The input parameters are thus calibrated with MWD and/or wireline data or data obtained from other techniques. The calibrated input parameters are then used in a wellbore stability model along with the laboratory time-dependent measurements.

For a given set of input parameters the wellbore stability model provided in FIG. 1B can perform in three modes of analysis. These are briefly described below:

Safe mud weight window prediction—Results obtained from this mode provide the upper and lower limit for a safe mud weight for a given composition of the drilling fluid as a function of the hole inclination angle and orientation. The upper limit in this case is the mud weight above which extension fracturing or fracture propagation would occur and would result in excessive drilling fluid losses. The lower limit is set by formation pore pressure or the minimum mud weight required to prevent borehole collapse, whichever is greater. In this mode, chemical and thermal interaction between the formation (mostly shale) and the drilling fluid can be incorporated.

Optimum chemical composition prediction (OBM)—In this mode of analysis the model provides the optimum chemical composition of the drilling fluid for a given mud weight, hole inclination and direction. In the absence of laboratory derived shale pore fluid potential, in-situ shale pore fluid potential can be predicted using a sub-module.

Optimum chemical composition of drilling fluid prediction (OBM) followed by safe mud weight window prediction—The model in this mode first optimizes the chemical composition of the drilling fluid for the actual (i.e., utilized currently in the field) mud weight followed by a prediction of the safe mud weight window as a function of hole angle for a given direction.

All three modes have access to an empirical rock strength estimation module, as shown in FIG. 1A.

The predictions from the wellbore stability model are sent to a visualization module (typically graphing of results) based on one of two types of activities—field implementation or feedback, as shown in FIG. 1A—to be executed. These activities provide feedback into the data collection, processing and interpretation process and field implementation of the wellbore stability model results, as shown in FIGS. 1A and 1B.

Wellbore Stability Model

The rationale for the wellbore stability model (total potential model) is as follows: The fundamental direct and coupled flow phenomena, induced hydraulic gradients, chemical potential, electrical potential gradients and temperature gradients all influence rock properties and wellbore or formation stability. In most practical cases, however, the flow phenomena induced by the hydraulic gradient (i.e., mud filtrate invasion driven by overbalanced mud weight) and the chemical potential difference between the drilling fluid and shale (or formation) pore fluid (e.g., osmotic or diffusion transport of water molecules and/or ions and/or (hydrated) solutes in and out of the shale, electrical potential, thermal potential, etc.) are generally considered to be the more relevant driving forces for formation (in) stability. At any given time during the drilling operation, the (in)stability issue is ultimately controlled by the relationship between the borehole stress-state and the rock strength. As the rock strength is inversely related to the water content of the shale (or of the formation of interest), modification of pore pressure is a fundamental parameter in altering the effective stress-state around the wellbore. Adequate mud weight density is also needed for borehole stability.

The model used in the method of this invention is preferably based on well-established modeling principles such as described in Mody, F. K. and Hale, A. H.: "A Borehole Stability Model To Couple the Mechanics and Chemistry of Drilling Fluid/Shale Interaction", paper SPE 25728, 1993 IADC/SPE Drilling Conf, Amsterdam, Feb. 23–25, 1993; Bradley, W. B.: "Failure of Inclined Boreholes", J. Energy Res. Tech. (Dec. 1979) 232: Trans., AIME, 101; Tare, U. A., and Mody, F. K.: "Novel Approach to Borehole Stability Modeling for ERD and Deepwater Drilling", paper SPE 52188, 1999 SPE Mid-Continent Operations Symposium Oklahoma City, USA, Mar. 28¥31, 1999; Tan, C. P., et al.: "Integrated Rock Mechanics and Drilling Fluid Design Approach to Manage Shale Instability", paper SPE 47259, SPE/ISRM Eurock '98, Trondheim, Norway, Jul. 8–10, 1998; and Ghassemi, A., et al.: "A Solution for Stress Distribution Around An Inclined Borehole in Shale", paper No. 043, Int. J. Rock Mech. Min. Sci. Vol. 35, No. 4/5, p.538–540, 1998, which are all incorporated herein by reference.

The first two of these references listed above have pertinent theoretically derived solutions to the model. The model incorporates chemical potential effects using the difference in the molar free energies (i.e., activity) of the drilling fluid and the shale pore fluid. Also incorporated in the model is the concept of reflection coefficient, σ, as discussed in Staverman, A. J.: "Theory of Measurement of Osmotic Pressure", Recueil des Travaux Chimiques des Pays-Bas, v.70, pp 344–352, (1951), incorporated herein by reference. The temperature difference between the formation and the drilling fluid directly affects the near-wellbore stress concentration. The model utilizes this temperature difference and calculates the effect of thermal stresses on the near-wellbore tangential stress where significant.

Experiments

Pore Pressure Transmission (PPT) Tests

Figure 2:
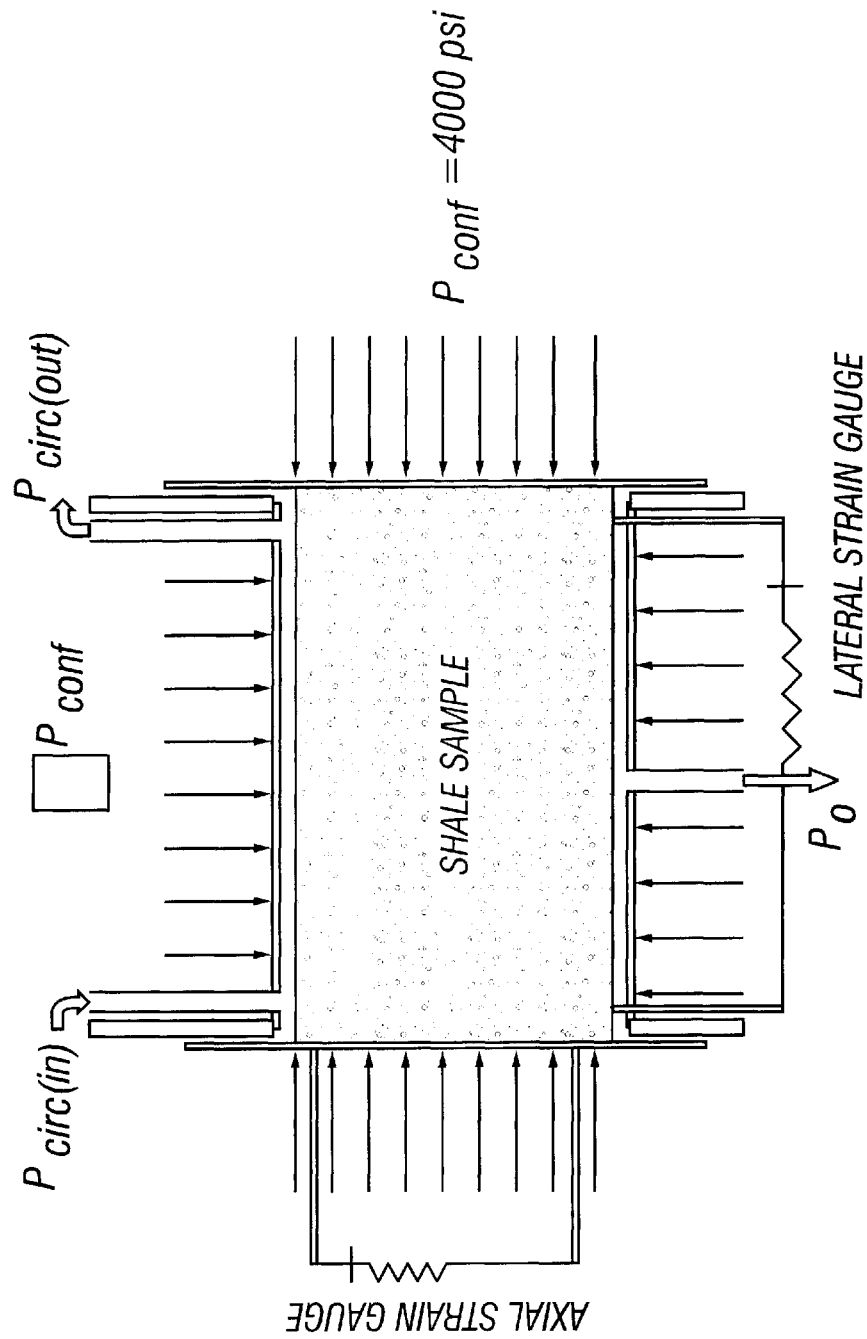
FIG. 2 is a schematic of a Pore Pressure Transmission experiment designed to study time-dependent alterations in shale properties as a function of drilling fluid exposure.

The Pore Pressure Transmission (PPT) experiment has been designed to study time-dependent alterations in shale properties as a function of drilling fluid exposure. A schematic of this test is shown in FIG. 2. The experiment consists of confining well-preserved shale cores or outcrops, under geostatic stress and then circulating (under confined dynamic conditions) test fluids at the upstream side while measuring changes in the downstream pressure. The upstream pressure may be increased to simulate overbalance conditions representing downhole conditions. Typically during a drilling operation, hydraulic overbalance is maintained to provide the formation with net radial support. The downstream pressure indicates changes in the sample pore pressure at some distance into the wellbore.

Experimental Setup for PPT Tests

The experimental setup consists of a jacketed steel pressure vessel with built in pressure ports, connections and acoustic transducers. The sample (1 in.×2 in.) is jacketed with a Teflon membrane after six extension-meter strain gauges are applied to measure the sample deformation. The entire assembly is placed in a temperature regulating device to ensure adequate control of the experimental temperature.

Summary of PPT Test Procedure

A shale sample is equilibrated at a hydrostatic confining pressure $P_{ic}$ (e.g. 500 psi), under external fluid pressure $p_o$ (e.g., 50 psi) on both ends, and at the specific test temperature. Fluid pressure is applied with simulated pore fluid. Once saturation is achieved, the upstream pressure line is closed. The confining pressure is then increased to the required level for consolidation, $P_{ic}$ (e.g., 4000 psi). The system remains closed until the pressures at both the sample ends have stabilized. Upstream and downstream pressure is allowed to stabilize and equilibrate.

Upon stabilization of the pore pressure, the sample is allowed to consolidate. The downstream pressure of the sample is monitored.

After the pressures at both ends have stabilized, the pore fluid is replaced with a drilling fluid that is circulated at a constant pressure. The transient pressure behavior, sonic compression and shear travel times, radial and axial deformation, temperature, and circulation rate are monitored.

PPT Test Details

The PPT tests provide a database including shale responses to various drilling fluids and salt solutions. For example, the PPT tests provide meaningful membrane efficiency numbers, allow for the study of more complex interaction between shale and drilling fluid to validate, verify, or confirm existing chemical potential poroelastic models, enable calibration of the shale response to known drilling fluids for optimum application in the field, and demonstrate simultaneous data acquisition of various responses to provide detailed shale property characterization as a function of drilling fluid exposure.

The three example fluids tested were a 20% w/w sodium chloride salt solution, a sodium silicate system comprising 20% w/w sodium chloride, and a polymer in solution comprising 20% w/w $CaCl_2$ salt and 2% KCl salt. It is important to establish a baseline of the shale response to the cation or cations that would be included in the drilling fluid system. Such a baseline helps in identifying or isolating shale alterations due to cation exchange. In addition this baseline helps differentiate, to a certain extent, the effects of the base salt solution and the effects of other shale modifying additives (e.g., silicates, polymers like partially-hydrolyzed poly-acrylamide, amphoterics etc.).

Discussion of Results

Based on the transient pore pressure response of Pierre II shale exposed to the test fluids, the sodium silicate solution comprising 20% w/w NaCl showed higher membrane efficiency numbers than the 20% w/w NaCl solution and the polymer in solution comprising 20% w/w $CaCl_2$ salt and 2% KCl salt (approximately 60% efficiency versus approximately 10% efficiency and approximately 5.30% efficiency respectively).

Figure 3:
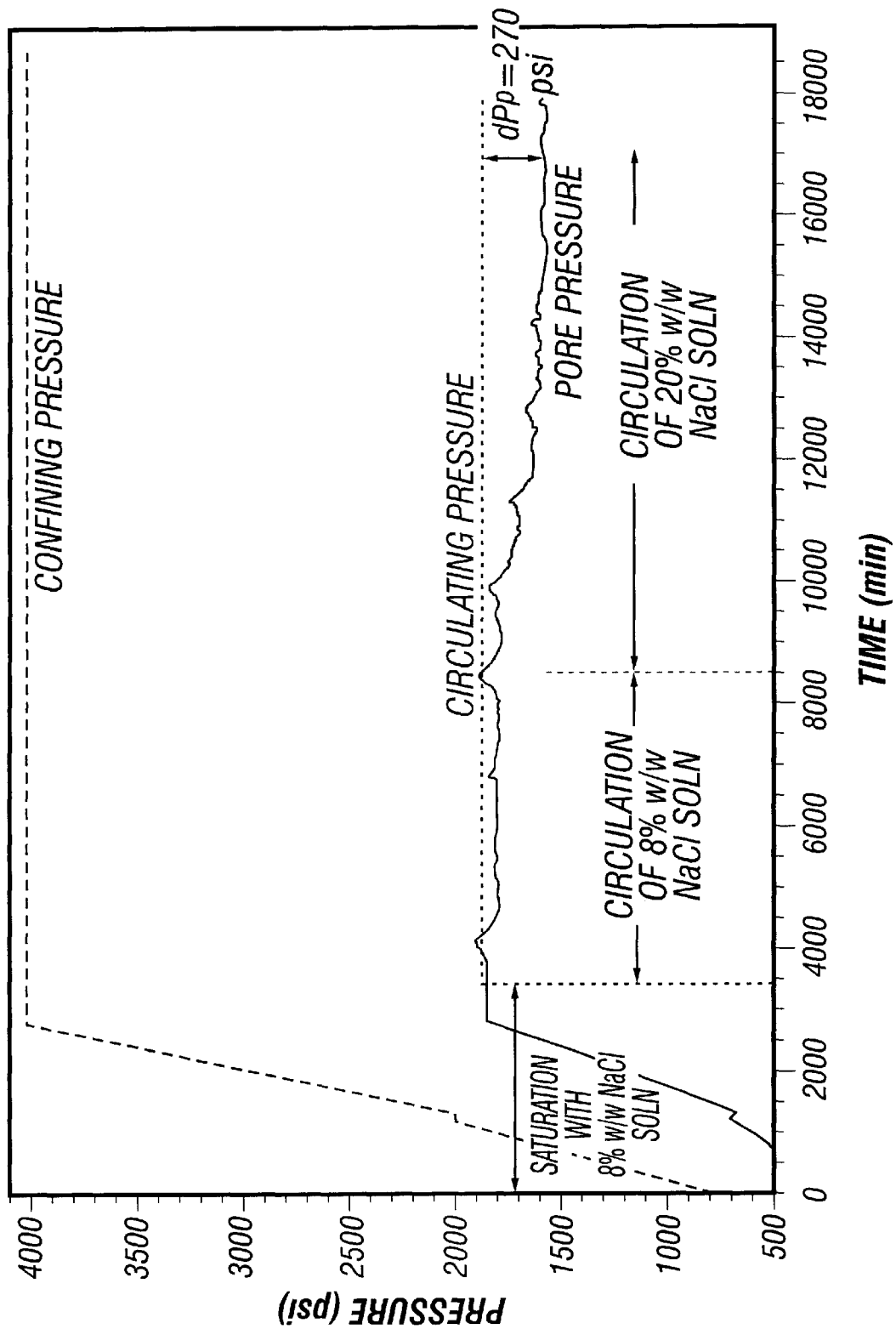
FIG. 3 is a graph of the time dependent transient pore pressure response of Pierre II shale when exposed to a 20% w/w NaCl solution.
Figure 4:
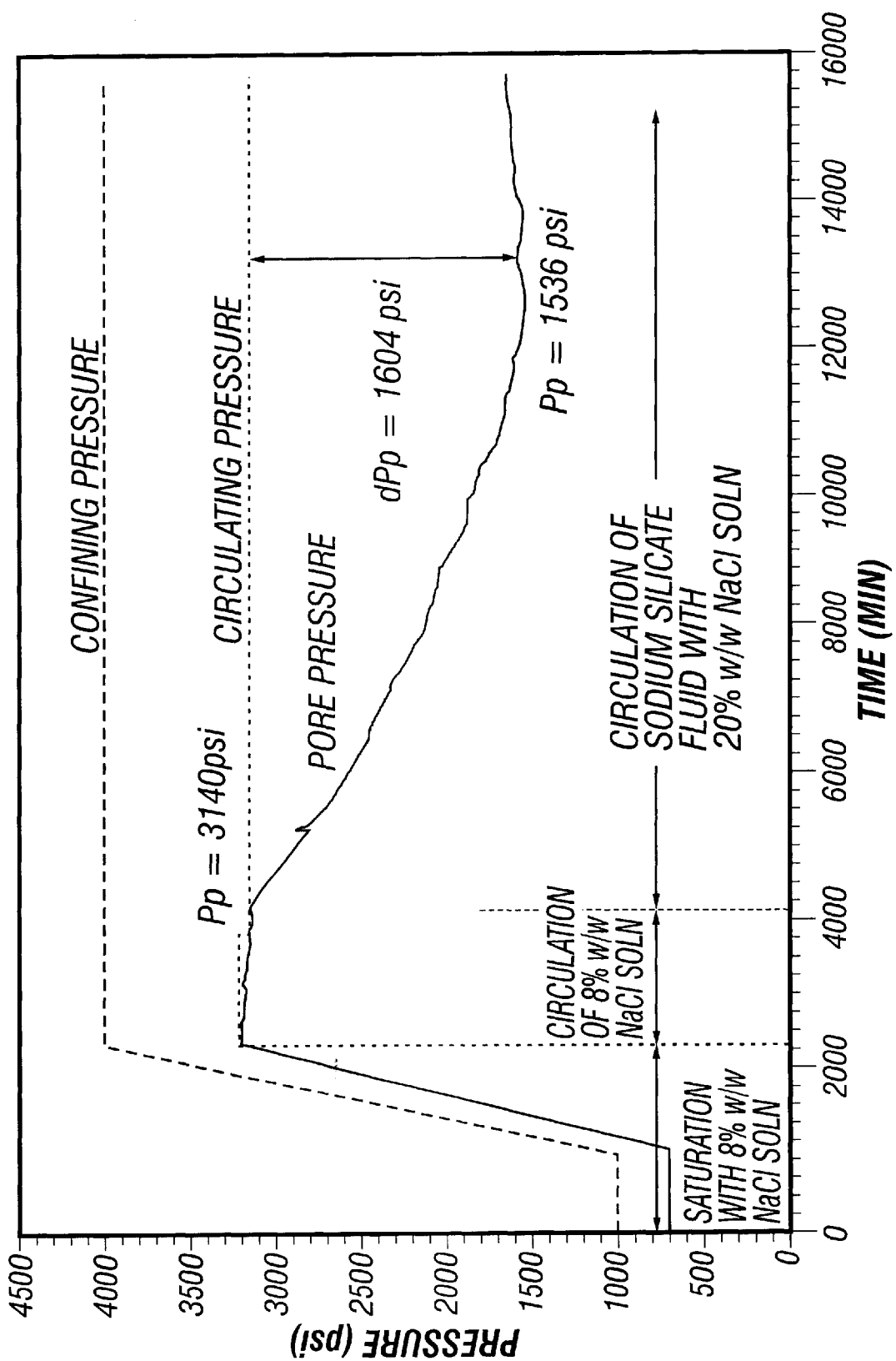
FIG. 4 is a graph of the time dependent transient pore pressure response of Pierre II shale when exposed to a sodium silicate solution containing 20% w/w NaCl.
Figure 5:
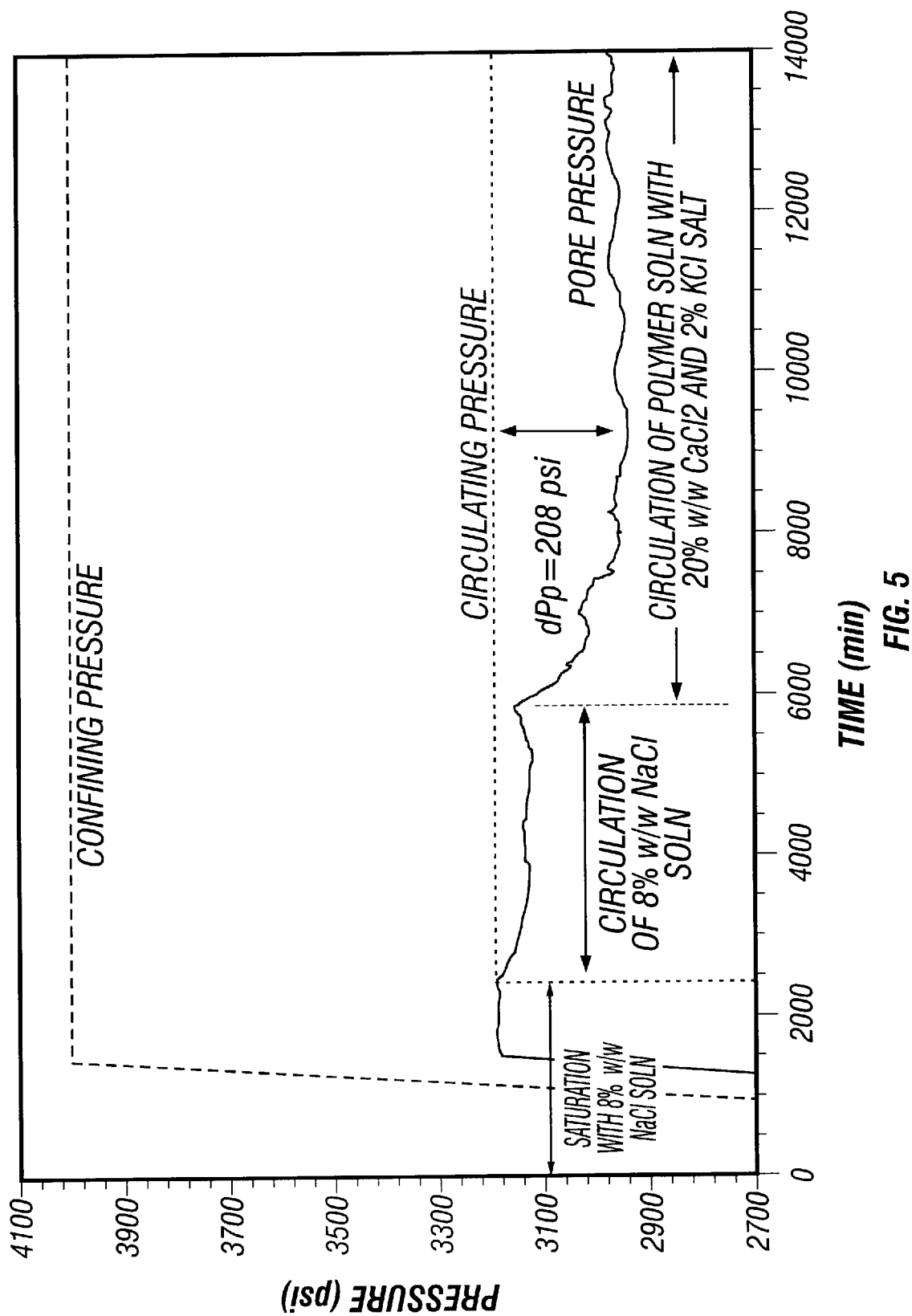
FIG. 5 is a graph of the time dependent transient pore pressure response of Pierre II shale when exposed to a polymer in solution containing 20% w/w $CaCl_2$ salt and 2% KCl salt.
Figure 6:
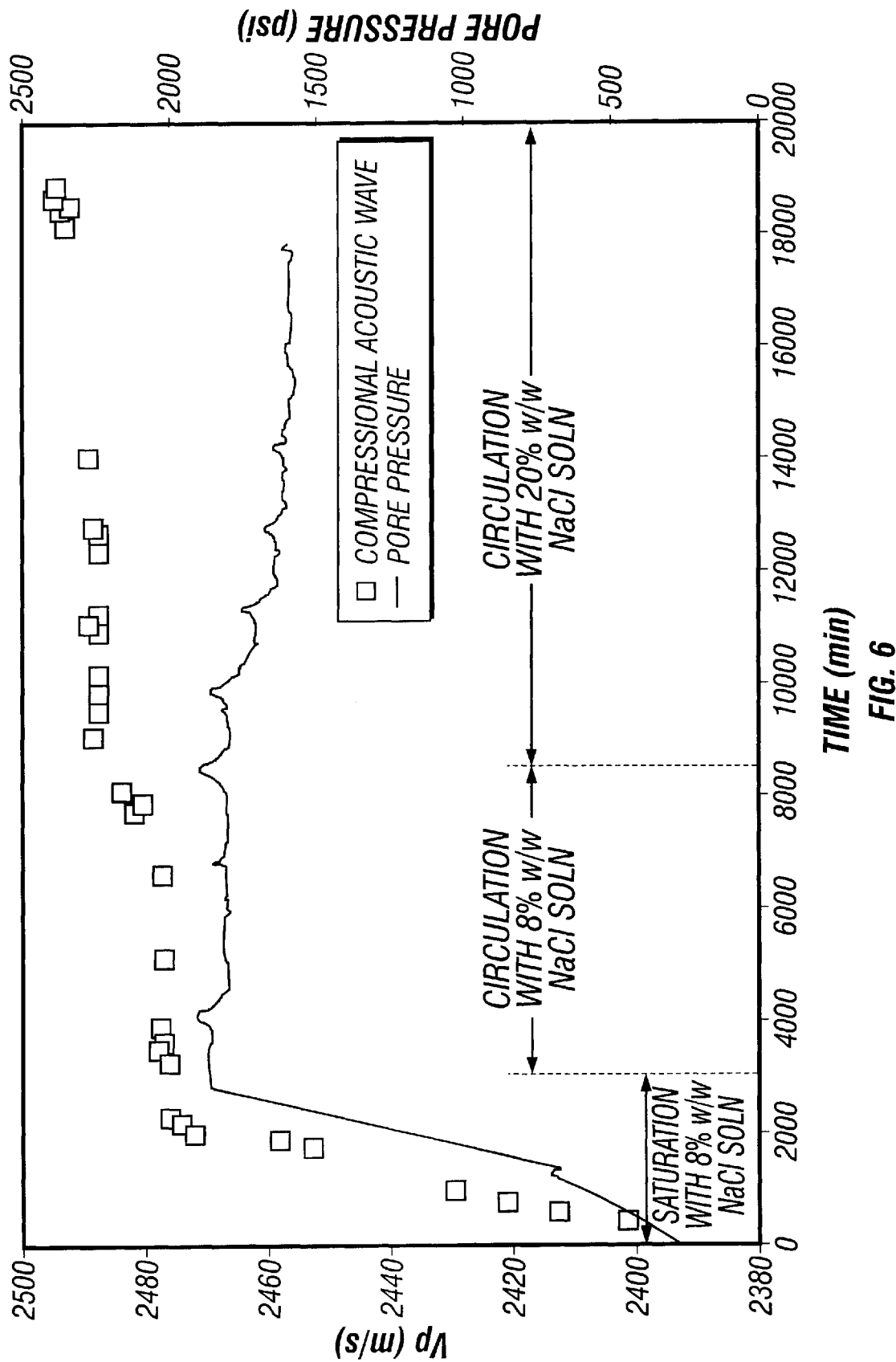
FIG. 6 is a graph of the shale compressional acoustic wave response of Pierre II shale when exposed to a 20% w/w NaCl solution.
Figure 7:
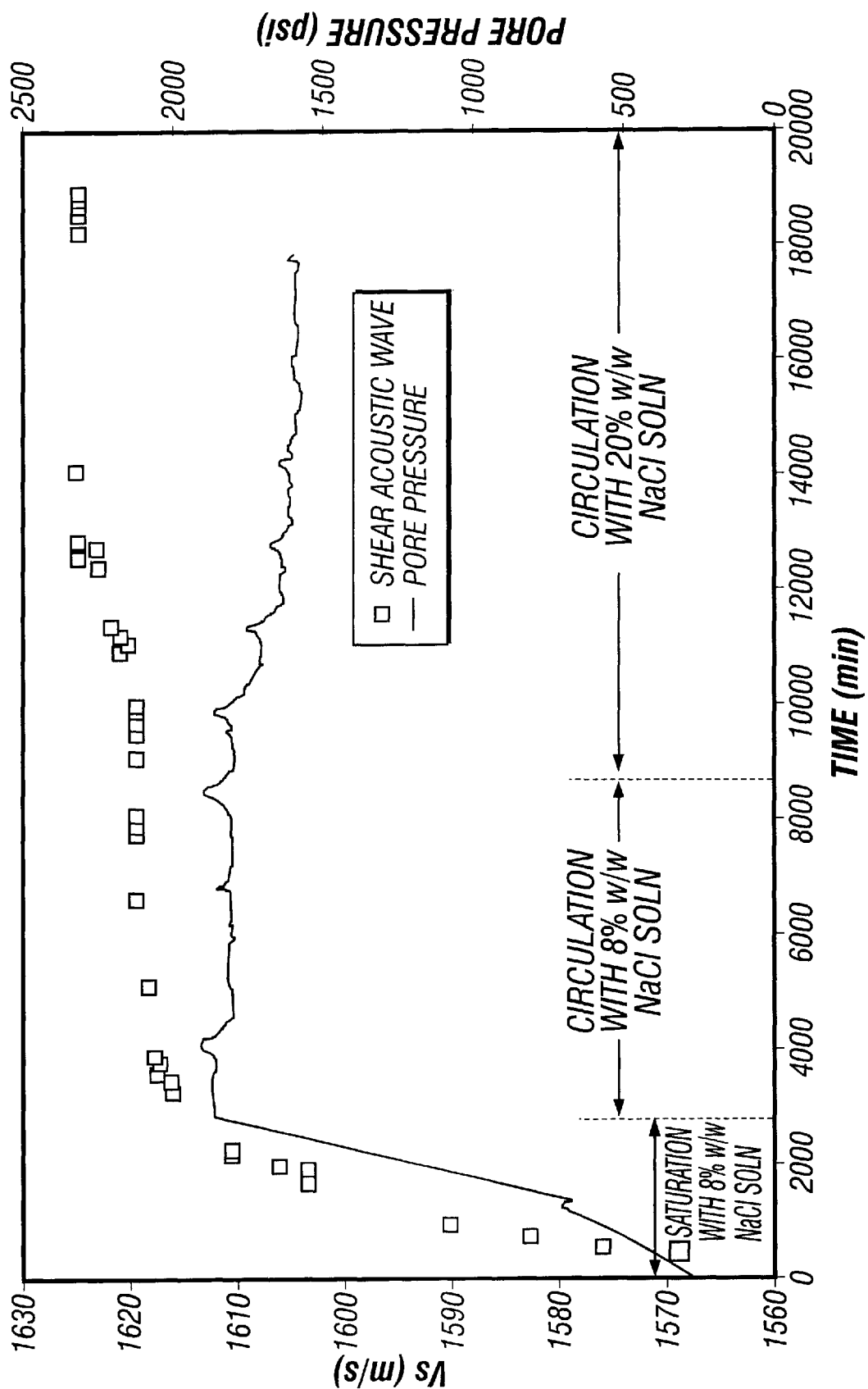
FIG. 7 is a graph of the shale shear acoustic wave response of Pierre II shale when exposed to a 20% w/w NaCl solution.
Figure 8:
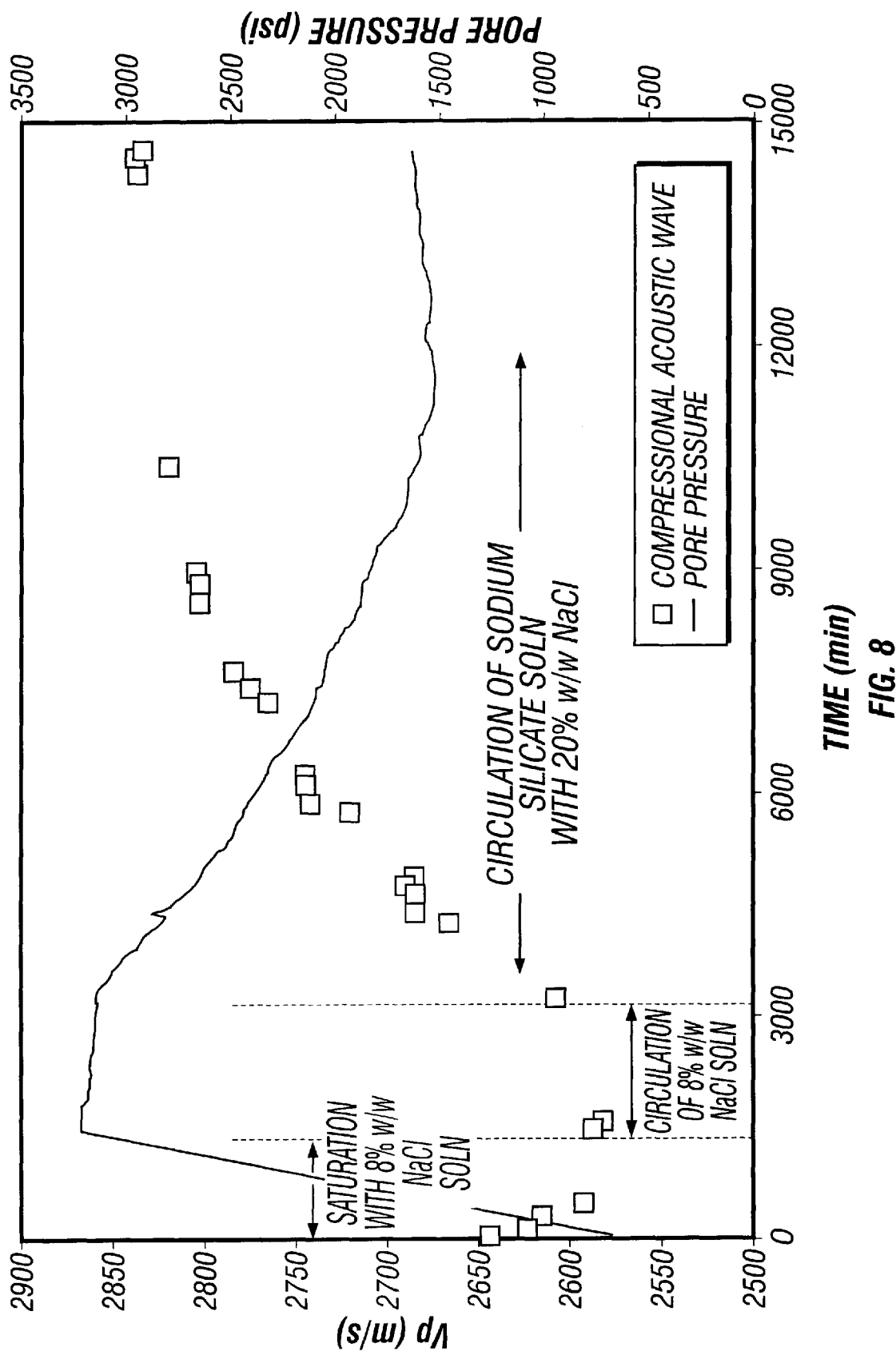
FIG. 8 is a graph of the shale compressional acoustic wave response of Pierre II shale when exposed to a sodium silicate solution containing 20% w/w NaCl.
Figure 9:
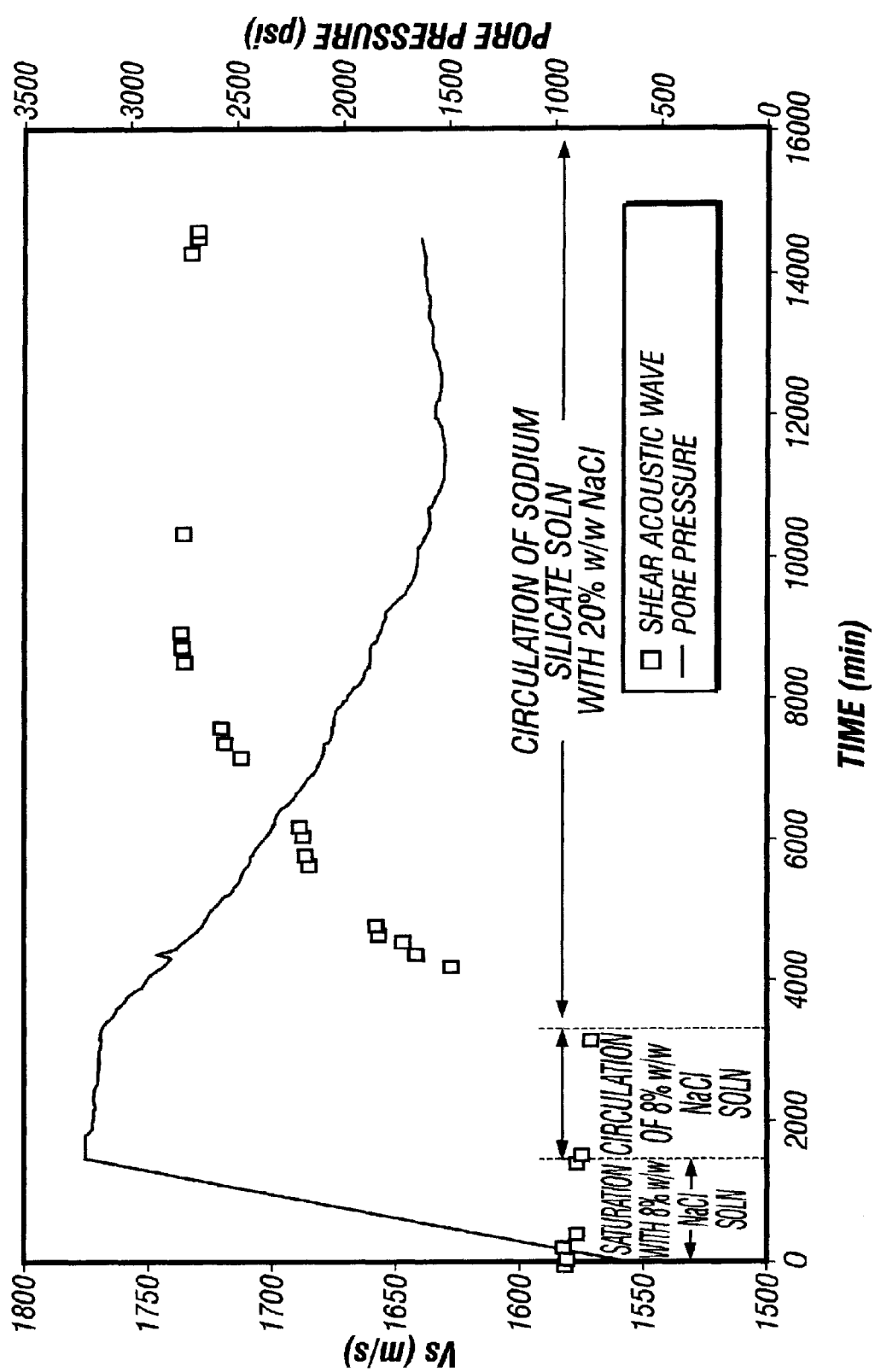
FIG. 9 is a graph of the shale shear acoustic wave response of Pierre II shale when exposed to a sodium silicate solution containing 20% w/w NaCl.
Figure 10:
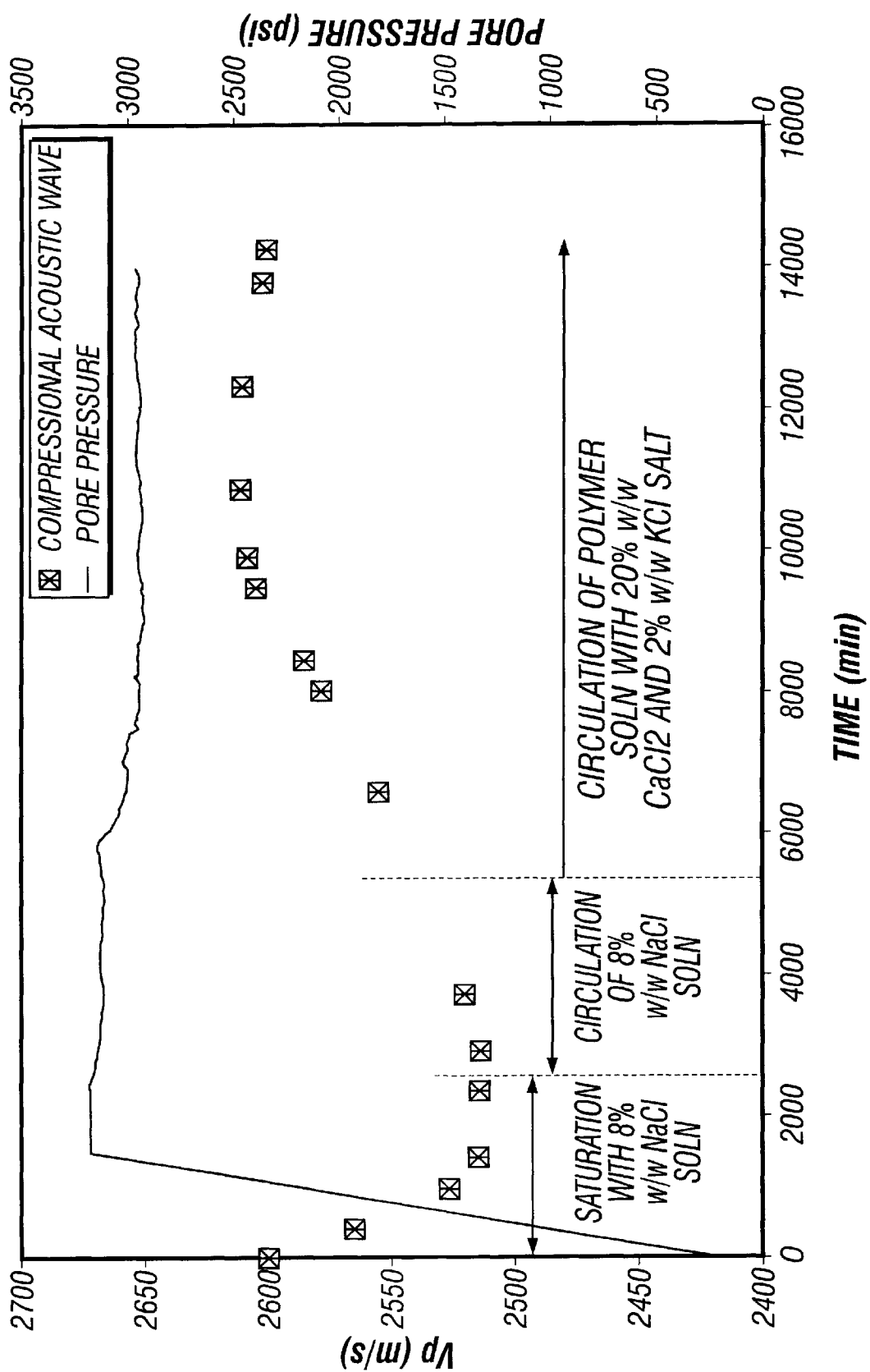
FIG. 10 is a graph of the compressional acoustic wave response of Pierre II shale when exposed to a polymer in solution containing 20% w/w $CaCl_2$ salt and 2% KCl salt.
Figure 11:
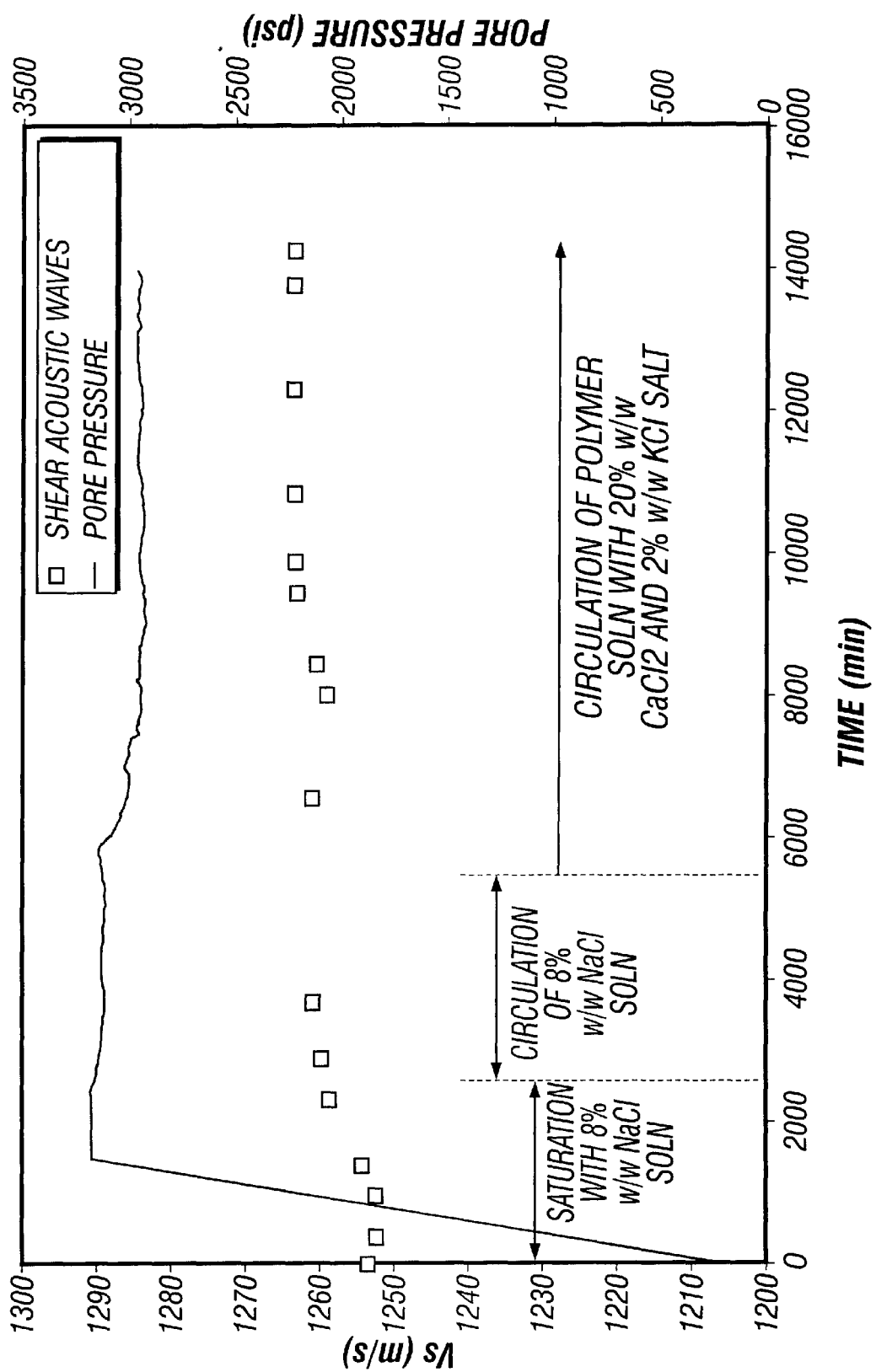
FIG. 11 is a graph of the shear acoustic wave response of Pierre II shale when exposed to a polymer in solution containing 20% w/w $CaCl_2$ salt and 2% KCl salt.

FIGS. 3, 4 and 5 show the time dependent transient pore pressure response of Pierre II shale when exposed to a 20% w/w NaCl solution, a sodium silicate system comprising 20% w/w NaCl and a polymer in solution comprising 20% w/w $CaCl_2$ salt and 2% KCl salt, respectively. The saturating fluid (simulated pore fluid) in all cases is 8% w/w NaCl solution. The shale acoustic (compressional and shear wave) response during the entire experiment for the 20% w/w NaCl solution is shown in FIGS. 6 and 7. FIGS. 8 and 9 provide the corresponding acoustic (compressional and shear wave) response of Pierre II shale when exposed to the sodium silicate solution comprising 20% w/w NaCl. FIGS. 10 and 11 provide the acoustic (compressional and shear wave) response of Pierre II shale when exposed to the polymer in solution comprising 20% w/w $CaCl_2$ salt and 2% KCl salt. One example rock property, the dynamic Young's modulus (E) (reflecting rock elasticity), calculated from the above acoustic data with respect to the three solutions is shown respectively in FIGS. 12, 13 and 14. Each of the FIGS. 3–14 indicates the three stages of the PPT test. First, the shale is saturated with 8% w/w NaCl (simulated pore fluid); second, 8% w/w NaCl is circulated until equilibrium; and third, the shale is exposed to the test fluid.

Table 1 provides transient pore pressure data and corresponding calculated membrane efficiency in tabular form for the test fluids when exposed to Pierre II shale.

TABLE 1

MEMBRANE EFFICIENCY CALCULATION

| Test Fluid | $Aw_{fl}$ | $Aw_{sh}$ | $\Delta P_{the}$ psi | $\Delta P_{exp}$ psi | $\sigma_1$ % $\Delta P_{exp}/\Delta P_{the}$ |
|---|---|---|---|---|---|
| 20% w/w NaCl solution | 0.83 | 0.95 | 2685 | 270 | 10.05 |
| Sodium silicate solution comprising 20% w/w NaCl | 0.83 | 0.95 | 2685 | 1604 | 59.74 |
| Polymer solution comprising 20% w/w CaCl$_2$ salt and 2% KCl salt | 0.78 | 0.95 | 3920 | 208 | 5.30 | where $\Delta P_{the}$ refers to the difference or change in theoretical pressure and $\Delta P_{exp}$ refers to the difference or change in experimental pressure.

The well known concept of "reflection coefficient" (i.e., membrane ideality) may be used for "leaky systems" including water based mud (WBM)/shale (or other formation) type systems for formation stability applications. For WBM/shale systems, membrane efficiency is not a clearly defined term (e.g., as an oil film on shales present in invert oil emulsion systems). The membrane efficiency of formation-fluid systems is due to a difference in mobility of water and solutes (ions) in shales. Thus membrane efficiency can be defined as:

$$\sigma = 1 - \frac{V^{solute}}{V^{water}} \quad (1)$$

If only the movement of water is allowed and all the solutes are rejected, the membrane is ideal semi-permeable (100% membrane efficiency or $\sigma=1$). However, for shales, the mobility of solutes is lower than that of water and the membrane is "non-ideal" or "leaky", $0<\sigma<1$. A non-ideal membrane does not entirely restrict the transport of solutes. Membrane efficiency ("reflection coefficient") has a relationship with at least two key parameters of the WBM/shale system, i.e., the average 'effective' shale pore radius and the radius of hydrated ions present in the drilling fluid system.

A mathematical representation to describe the driving force for the movement of water by an osmotic mechanism and one way or means of estimating membrane efficiency directly is shown in the following equation:

$$\left(\frac{RT}{V}\right) \times \ln\left(\frac{A_{wdf}}{A_{wsh}}\right) = \pm(\sigma \times \Delta P_p) = \pm \sigma \times (P - Pp) \quad (2)$$

where $Aw_{df}$ is the water activity of the drilling fluid, which can be estimated a number of known ways, most notably, by partial vapor pressure determination, boiling point elevation, or directly using a hygrometer; $Aw_{sh}$ is the water activity of the shale pore fluid and can be measured (for preserved shale cores) by partial vapor pressure determination; Pp is the far-field pore pressure; P is the near wellbore pore pressure; and $\sigma$ is the membrane efficiency term, or "reflection coefficient", specific to a shale/drilling fluid system.

Further discussion of the calculation of membrane efficiency may be found in references Mody, F. K. and Hale, A. H.: "A Borehole Stability Model To Couple the Mechanics and Chemistry of Drilling Fluid/Shale Interaction", paper SPE 25728, 1993 IADC/SPE Drilling Conf., Amsterdam, Feb. 23–25, 1993, and Staverman, A. J. "Theory of Measurement of Osmotic Pressure", Recueil des Travaux Chimiques des Pays-Bas, v.70, pp 344–352, (1951), which are incorporated herein by reference.

While the membrane efficiency for a 20% w/w NaCl solution when exposed to Pierre II shale is 10.05%, and the membrane efficiency for a polymer in solution comprising 20% w/w CaCl$_2$ salt and 2% KCl salt when exposed to Pierre II shale is 5.30%, the membrane efficiency for sodium silicate systems is significantly higher at about 60%. For reference, an oil-based mud has a theoretical membrane efficiency close to 100%. Following the response of a sodium silicate solution with 20% w/w NaCl, the shale pore pressure decreases as a function of exposure time to the solution. Comparing the results among the three test fluids indicates that, when membrane efficiency numbers are significantly higher, drilling fluid water activity that is lower than the shale pore fluid activity tends to reduce pore pressure and thereby contributes towards reducing near-wellbore effective stresses on a time-dependent basis.

Figure 12:
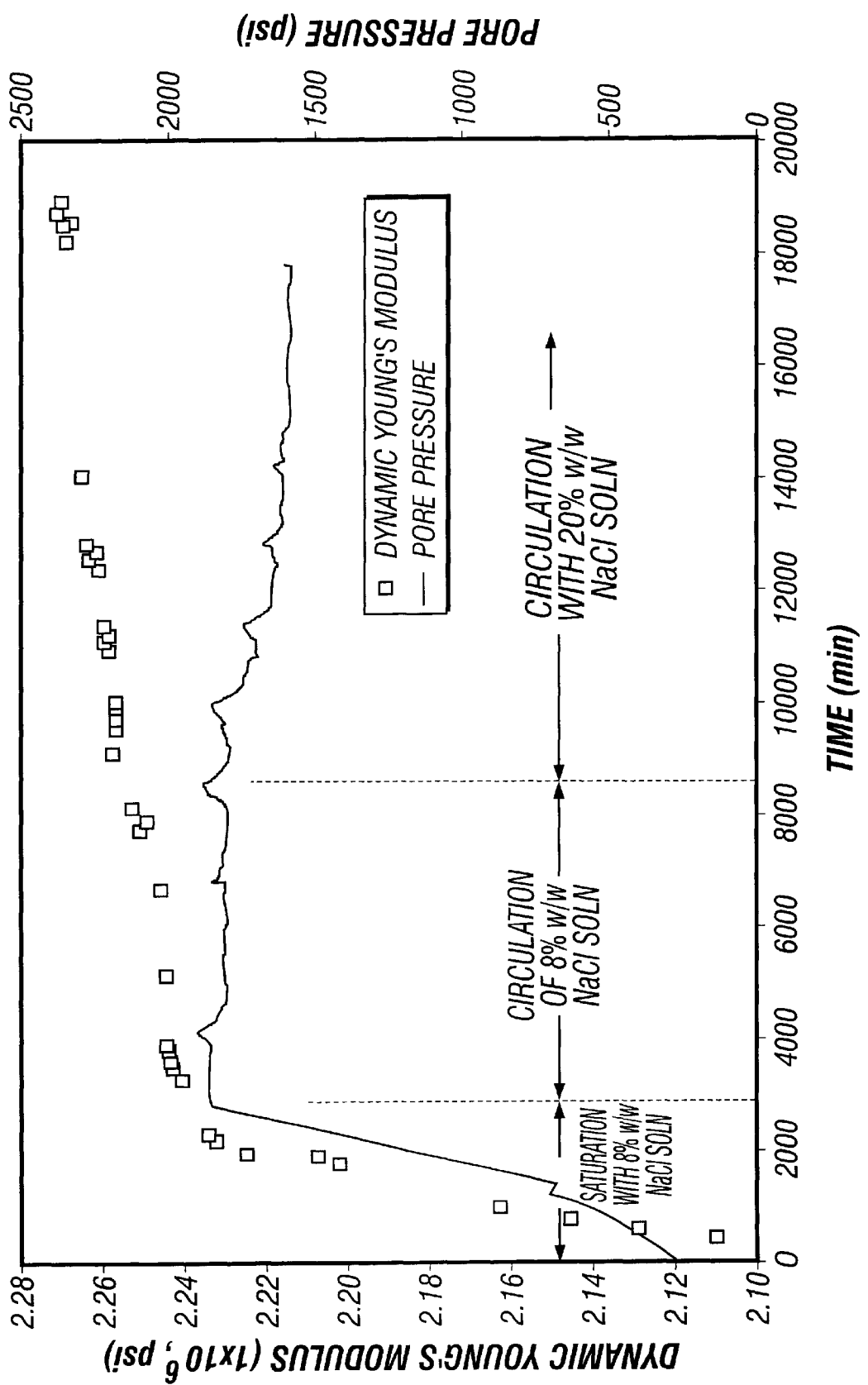
FIG. 12 is a graph of dynamic Young's modulus as a function of transient pore pressure for Pierre II shale exposed to a 20% NaCl solution.
Figure 13:
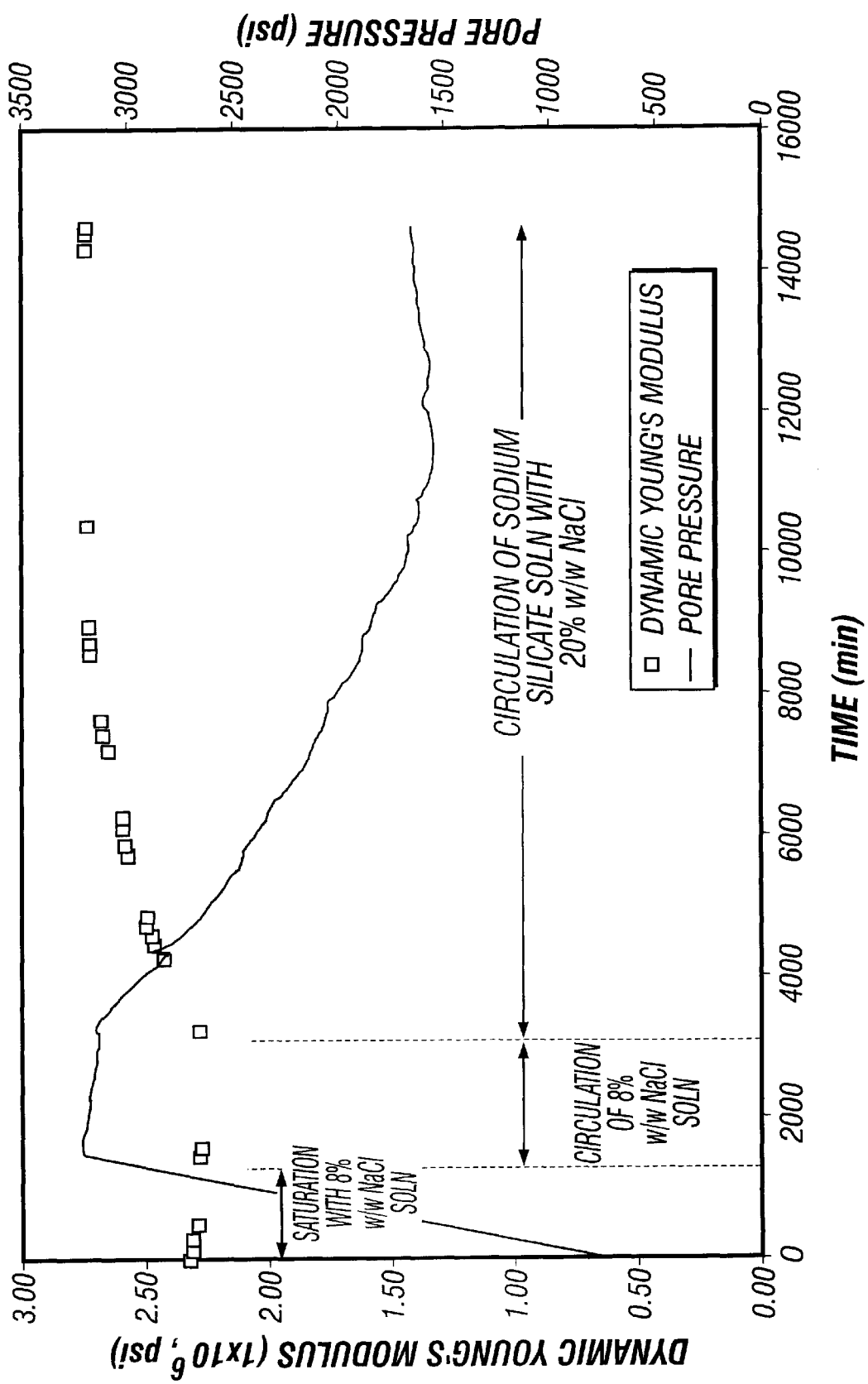
FIG. 13 is a graph of dynamic Young's modulus as a function of transient pore pressure for Pierre II shale exposed to a sodium silicate solution containing 20% w/w NaCl.
Figure 14:
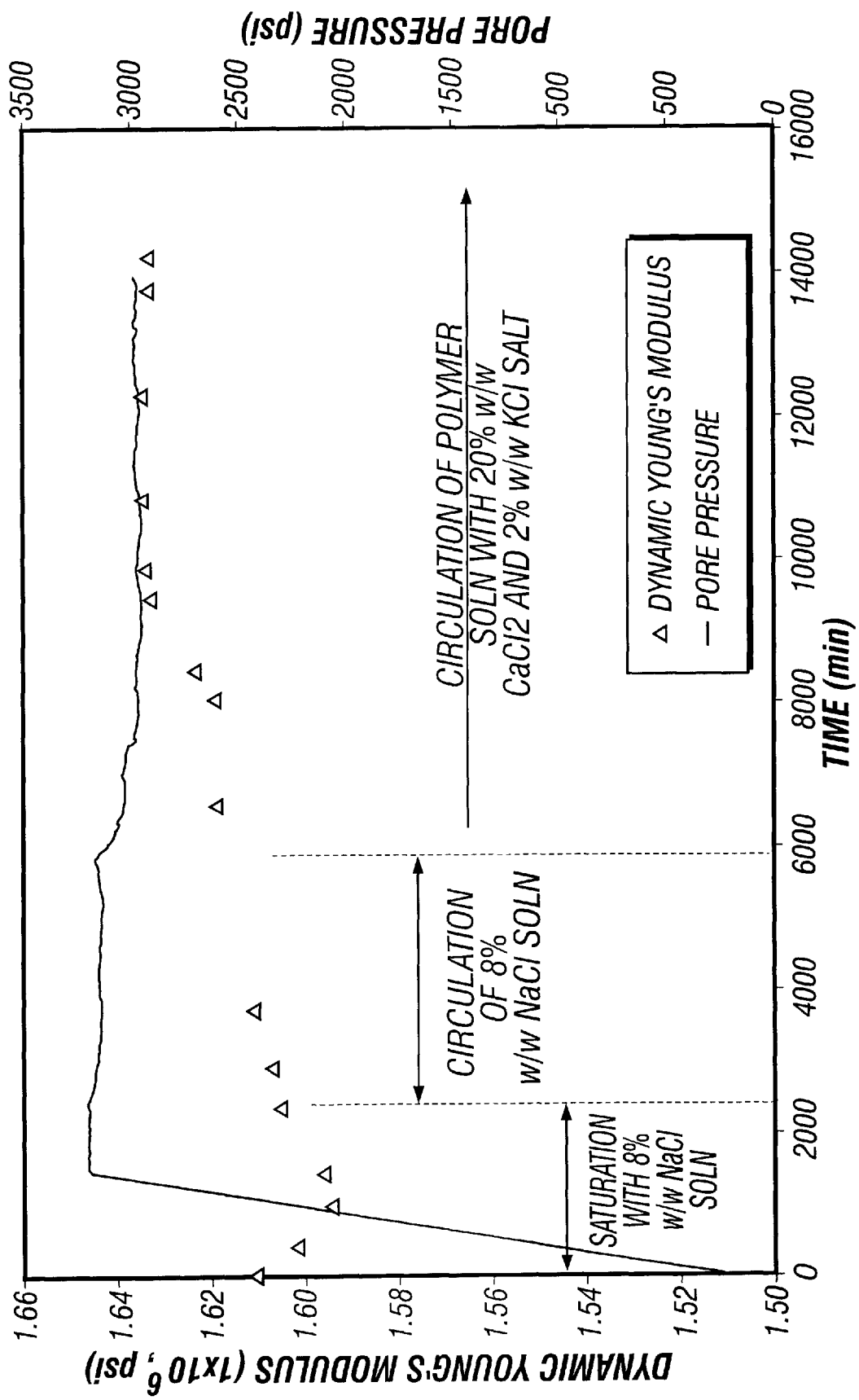
FIG. 14 is a graph of dynamic Young's modulus as a function of transient pore pressure for Pierre II shale exposed to a polymer in solution containing 20% w/w $CaCl_2$ salt and 2% KCl salt.

Acquisition of acoustic data simultaneously with exposure of the rock to drilling fluid, in the field and in the PPT tests provides useful data to calculate dynamic changes in the rock properties, changes that may be a result of that exposure. Comparing FIGS. 12, 13 and 14 shows changes in the dynamic Young's modulus as a function of transient pore pressure. Young's modulus, which is a measure of the stiffness or elastic properties of a rock, is but one example of a rock property. Similar computations can be made for dynamic Poisson's ratio and other rock properties derived from sonic data. In the example, when shale is exposed to 20% w/w NaCl solution, the effective stress changes from 2105 psi immediately after displacement to 2375 psi when the transient pore pressure has reached its lowest point (FIG. 3). For the case when Pierre II shale is exposed to the sodium silicate fluid the effective stress increases from 860 psi immediately after displacing the simulated pore fluid with the test fluid to 2464 psi at the lowest point on the transient pore pressure curve (FIG. 4). Inherent changes in effective stress can be observed from velocity data. For example, comparing FIGS. 6 and 10 with 8 shows a dramatic change in the compressional wave sonic velocity when the shale is exposed to the two test fluids. Similar observations can be made for the shear wave velocity profiles by comparing FIGS. 7 and 11 with 9. These comparisons provide additional means of observing transient pore pressure in the shales as a function of test fluid exposure.

This test example shows that mud systems should be calibrated, preferably with shale cores under in-situ conditions. PPT tests can provide meaningful membrane efficiency numbers which can then be used in a wellbore stability model for a realistic analysis. Additionally, a time-dependent chemical potential related shale transient pressure can be obtained, which can be used to analyze exposure time related borehole deterioration observed (based on the nature of the curve).

Input Parameters for Real-Time Wellbore Stability Modeling

Table 2 provides a list of input parameters for real-time borehole stability analysis according to the method of the invention and the possible sources where the data needed for the analysis can be obtained. The input parameters can be divided into five categories.

These are:
a) Insitu Stresses.
b) Formation Data.
c) Well Path Data.
d) Drilling Fluid.
e) Rock Strength.

Each of the above categories can be further sub-divided into individual subcategories. The possible sources for obtaining information for each input parameter subcategory are provided in Table 2 (under the column heading Possible Source). The Input Parameters categories are discussed below:

(a) In-situ Stresses—These stresses affect the mud weights used to drill a borehole. When the stresses are higher than the rock strength failure occurs. The principle stresses control both fracturing as well as the collapse mode of wellbore failure. There are three principle earth stresses. The in-situ stresses are the minimum horizontal stress, maximum horizontal stress and the overburden stress. In a normal faulting environment such as that typically found in the Gulf of Mexico (away from any tectonic activity), the minimum horizontal stress is the least principle stress, the maximum horizontal stress is the intermediate principle stress, and the overburden stress in the maximum principle stress. The major source for obtaining magnitudes of the least principle stress in formations is by pressure testing in open boreholes. Information can be obtained from tests such as a leak-off test, extended leak-off test, mini-frac test, etc. Direction of the intermediate principle stress is obtained by measuring the location of borehole ovality (break-outs); the magnitude is estimated by back-calculating the break-out width for a given intermediate stress and the other two principle stresses, pore pressure and the rock strength. Comparison is made between the estimated and the actual observed breakout width. The overburden stress is typically obtained from an integrated bulk density log, by the actual measurement of drilled cuttings, etc.

(b) Formation Data—This data can be categorized into four sub-categories: temperature; rock properties; shale or pore water salinity; and pore pressure. Formation data is different for different formations. The formation temperature is typically estimated by running temperature measurement while drilling tools, infra-red techniques, etc. Rock properties are obtained either by direct measurement of actual cores in the laboratory or by empirical correlations based on wellbore measurements. Rock properties aid in modeling deformation behavior of specific formations. Shale activity or pore water salinity is used to estimate the chemical potential of the formation. A difference in potential between the drilling fluid and formation induces flow phenomenon from one to the other, i.e., flow occurs from higher potential to the source that contains lower potential. Osmotic membrane efficiency and the osmotic pressure are based on shale water activity. Shale water activity can be obtained from log based empirical correlations as provided in Table 2 or by actually measuring the relative humidity of a well preserved shale core in the laboratory. Pore pressure is critical information for drilling a well. Pore pressure affects the minimum mud weight used to drill and is related to total potential of the formation. Pore pressure is typically obtained from pressure build-up tests like drill-stem testing and repeat formation testing, as well as from empirical correlations using log and seismic information.

(c) Well Path—Drilling data includes well trajectory information like hole angle, well azimuth and other associated information on geology like presence of faults and other structures. Case histories of successful mud programs will also be a part of the drilling data.

(d) Drilling Fluid—This category includes three sub-categories. The drilling fluid density (Mud weight) can be captured in real-time (while drilling) by means of a pressure while drilling (PWD) tool. Accurate information of mud weight is necessary to ensure wellbore stability. Field and laboratory densitometers may suffice if downhole tools measuring mud weight are not installed. Drilling fluid activity is a measure of the chemical potential of the drilling fluid. A difference in the activity of the drilling fluid and the shale pore fluid would induce osmotic fluid flow in the presence of a semi-permeable membrane. Drilling fluid activity can be measured directly using a hygrometer or a relative humidity meter or indirectly by for example estimating solute concentrations in titration experiments. Membrane efficiency is a critical parameter that determines the effectiveness of a semi-permeable membrane to allow only the transport of fluids relative to the transport of solutes. Membrane efficiency of a drilling fluid—shale formation system can be estimated by laboratory measurements in a pore pressure transmissions test (PPT) apparatus. Time lapsed measurements of shale properties of shales exposed to drilling fluids in a borehole can also lead to membrane efficiency estimations. Pore radii along with solute sizes and concentration may provide alternate ways of estimating membrane efficiency.

(e) Rock Strength—Rock strength can be differentiated between two types—the compressive strength and the tensile strength. Rock strength is a critical input parameter along with the stresses and can be defined by various failure models. The existing real-time wellbore stability process includes but is not be limited to failure models such as the Mohr-Coulomb Failure Criterion, Drucker-Prager model, Modified Lade Criterion, Hoek and Brown Expression, Johnston and Chiu Model, Peak Strength Criterion, Uniaxial Compressive Strength limitation, etc. Ideally direct measurements of stress versus strain on well-preserved core samples in the laboratory in a poly-axial cell is preferred. In the absence of core samples various tests on drill cuttings and empirical correlation's using log data can provide rock strength estimations. For example if the water content of the shale can be estimated then a proprietary empirical correlation that uses water content and shale composition can be used to estimate rock strength.

Therefore,

Rock Strength $f$(Shale Property)

For example, Shale Property=Water content or Brinell Hardness or Cation Exchange Capacity or Porosity etc.

The numbers in Table 2 below have the following meanings:
1. X-ray Analysis of cuttings.
2. Nuclear Magnetic Resonance (NMR) logs (Wireline and/or MWD).
3. Resistivity/Conductivity logs (Wireline and/or MWD)
4. Mud Logs
5. Acoustic/Sonic compressional and shear wave logs (Wireline and/or MWD)
6. Pressure and Sampling tools like drill stem testing (Wireline and/or MWD) and repeat formation testing (RFT) tools.
7. MDT 8. Spontaneous Polarization (SP) Curve logs
9. Seismic processing/Vertical Seismic Profiling (VSP) techniques.
10. Pore pressure ahead of the bit techniques.
11. Pressure While Drilling (PWD) logs (MWD).
12. Empirical and analytical models using drilling fluid rheology, pressure, cuttings accumulation and temperature.
13. Leak-off test (LOT), Extended Leak-off Test (XLOT), Minifrac tests, Microfrac Tests, Formation Integrity Tests (FIT), Casing Integrity Tests (CIT).
14. Anelastic Strain Recovery (ASR) Techniques (including tests performed on cores and downhole)
15. Regional bulk density trends.
16. Integrated bulk density logs (Wireline and/or MWD)
17. Acoustic, four and six arm Caliper logs (Wireline and/or MWD), information on breakout angles, breakout volume and breakout length, etc.
18. Formation Evaluation (FE) Logs (Wireline and/or MWD)
19. Temperature logs (Wireline and/or MWD)
20. Neutron source (Nuclear) or Gamma-ray logs like neutron-slow-neutron logs, Double- or Multiple-Spaced Neutron (MS Neutron Curve)—Dual-Spacing Neutron Curve, Flowing Neutron Log (Nuclear Flolog-Lane-Wells), etc. (Wireline and/or MWD)
21. Formation Imaging logs (Wireline and/or MWD).

TABLE 2

List of input parameters for real-time wellbore stability analysis and possible sources where the data required to do the analysis can be obtained:

| Possible Source | Intermediate Parameters | Input Parameter | |
|---|---|---|---|
| 13, 14, empirical and analytical methods using log and regional information like the Daine's method, Eaton's technique, Pennebaker method, etc. | | Minimum Horizontal Stress | INSITU STRESSES |
| 15, 16, empirical methods using log information and compaction trends, measurements on drill-cuttings (cuttings density measurements), etc., | | Overburden Stress | |
| 14, 17, 21, fault stability and reactivation models, | Inequality (magnitude) and direction of horizontal stresses | Maximum Horizontal Stress | |
| 19, field measurements like using infra-red techniques | Formation temperature and flow-line temperature | Temperature | FORMATAION DATA |
| Laboratory analysis of cores, measurements on cuttings, pressure pulsing the well, 2, 3, 5, 9, 13, 14, 20 | Poisson's Ratio, Young's Modulus, Thermal Expansion coefficient, fluid and grain volume expansion factor, rock and fluid compressibility, rock and fluid bulk modulus, Skempton's Pore Pressure Coefficient, Biots Constant, etc., | Rock Properties | |
| Log based empirical correlation's using the following measurements −2, 3, 6, and 20. Laboratory measurements of shale cores using testing methods like, adsorption isotherm method, hygrometer reading and other relative humidity measurements, determination of shale pore water salinity from sand pore water salinity overlaying and underlying the shales | | Shale Activity/Pore Water Salinity | |
| 9, 3, 5, Pressure Build-up tests like 6 and 7, 4, 2, 10, Ratio Methods, empirical methods using log information and compaction trends, etc., | Pore Pressure Gradient | Pore Pressure | |
| Loggers or Drillers Depth, Reservoir modeling and interpretation tools | Depth, Well trajectory | Drilling Data | WELL PATH |
| Seismic information, drilling data, 18, etc. | Geologic information (presence of faults and types of faults) | | |
| Case history for a local well where no or very few problems were seen | Successful mud programs | | |
| 11, 4, 12 | Static and equivalent circulating density. | Mud Weight | DRILLING FLUID |
| Laboratory titration experiments like the Baroid method and the API method, drilling fluid daily reports | | Drilling Fluid Activity | |
| Laboratory testing of preserved shale cores using experiments like the Pore Pressure Transmission (PPT) test, Linear Swell Meter Tests, measuring changes in formation properties using field information like, 2, 3, 5, 9, 13, 16, 17, 18, 19, 20 Microscopic Imaging Techniques, Physical Intrusion Techniques like mercury injection, and nuclear techniques such as using nuclear magnetic resonance techniques (laboratory or wireline or MWD), 2 | Time dependent changes in formation water content, porosity, resistivity, sonic velocity and travel time, formation density, etc. Pore radii and distribution, solute/water relative mobility | Membrane Efficiency | |
| 1, 2, 3, 4, 5, 8, 9, 18 | Clay Content and Formation Type | ROCK STRENGTH | |

TABLE 2-continued

List of input parameters for real-time wellbore stability analysis and possible sources where the data required to do the analysis can be obtained:

| Possible Source | Intermediate Parameters | Input Parameter |
| --- | --- | --- |
| 3, 4, Di-adsorption methods such as Methylene Blue Tests or Compulsive Exchange Methods like the barium chloride compulsive exchange method | Cation Exchange Capacity (CEC)/Surface Area, Ionic Strength Modification Exchange Equations | |
| 2, 3, 4, 5, 8, 10, 15, 16, 18, 20 | Formation Water Content/Porosity/Permeability | |
| Laboratory analysis of cores, empirical correlation's using the following sources −1,2, 3, 4, 5, 17, 18, 20 and formation dielectric constant measurement. | | |

In applying the method of this invention, at least some understanding of the drilling fluid/formation interaction should preferably be obtained prior to applying any total potential or wellbore (in)stability model for a real-time drilling operation. A Pore Pressure Transmission (PPT) test or any other relevant test can be used to estimate the impact of a drilling fluid on the formation properties i.e., including but not limited to transient pore pressure, water content, electrical properties, acoustic properties, etc.

Changes in the shale stress due to alterations of the above mentioned properties can be obtained from the simultaneous acquisition of sonic compression and shear wave velocity data. A time-dependent total potential related shale transient pressure obtained from the PPT can be used to address issues where exposure time related borehole deterioration is observed.

The foregoing description of the invention is intended to be a description of preferred embodiments. Various changes in the details of the described method, including without limitation details concerning the wellbore stability model, can be made without departing from the intended scope of this invention as defined by the appended claims.

We claim:

1. A method employing drilling fluid for drilling a wellbore penetrating a subterranean formation, said method comprising real-time monitoring of the stability of said wellbore using a wellbore stability model during said drilling of the wellbore and said method further comprising:
   (a) obtaining preliminary values for mud weight and chemical composition of said drilling fluid using said wellbore stability model;
   (b) measuring acoustics, sonic, electrical thermal and transient pressure responses of the formation;
   (c) calibrating said wellbore stability model with said measurements; and
   (d) obtaining values for drilling mud weight and chemical composition of said drilling fluid using said calibrated wellbore stability model.

2. The method of claim 1 wherein said chemical composition values comprise values for salinity.

3. The method of claim 1 further comprising repeating steps (b) and (d) during drilling of said wellbore.

4. The method of claim 1 further comprising adjusting said drilling mud weight and salinity of said drilling fluid based on said values obtained with the calibrated wellbore stability model.

5. The method of claim 1 wherein said formation comprises shale.

6. The method of claim 1 wherein the measurements of step (b) are taken simultaneously during drilling of the wellbore in said formation.

7. A method employing well service fluid for servicing a wellbore penetrating a subterranean formation said method comprising real-time monitoring of the stability of said wellbore using a wellbore stability model during said servicing of said wellbore, said method further comprising:
   (a) obtaining preliminary values for weight and chemical composition of said well service fluid using said wellbore stability model;
   (b) measuring acoustic, sonic, electrical, thermal and transient pressure responses of the formation;
   (c) calibrating said wellbore stability model with said measurements; and
   (d) obtaining values for the weight and chemical composition of said well service fluid using said calibrated wellbore stability model.

8. A method for enhancing the recovery of hydrocarbons from a hydrocarbon bearing formation employing enhanced recovery fluids, said method comprising real-time monitoring of the stability of said formation using a wellbore stability model during said enhanced recovery.

9. A method for producing hydrocarbons from a hydrocarbon bearing formation while monitoring the stability of said formation, said method comprising real-time monitoring of the stability of said formation using a wellbore stability model during said production.

10. A method for maintaining stability of a wellbore penetrating a subterranean formation during drilling or well servicing operations, or during production or enhanced recovery operations, using fluids introduced into said wellbore to facilitate said operations, said method comprising:
   estimating characteristic properties of the formation ;
   estimating in-situ stresses in the formation;
   estimating or determining characteristic properties of said fluids;
   estimating the rock strength of said formation;
   conducting at least one pore pressure versus time laboratory test based on said estimations of fluid properties, formation properties, and rock strength;
   employing results of said test, said estimations of formation Properties, in-situ stresses, rock strength and said fluid properties in a wellbore stability model;
   using results from said model to adjust estimates of said formation properties, in-situ stresses in the formation; and rock strength to update said wellbore stability model or using results horn said model to adjust the properties of said fluids to maintain or enhance said rock strength;
   continuing during said operations to estimate or measure characteristic properties of the formation and of said fluids during said well operations and continuing to repeat or update on a real-time basis the estimates of in-situ stresses and rock strength based on said properties, wherein said characteristic properties of the formation which are measured during said wellbore operations comprise acoustic, sonic, electrical, thermal, and transient pressure responses of the formation; and continuing to update the wellbore stability model and continuing to adjust on a real-time basis the properties of said fluids as needed to maintain or enhance said rock strength during said operation.

11. The method of claim 10 wherein at least the weight and salinity of said fluids are adjusted in accordance with results from said wellbore stability model.

12. A method for maintaining stability of a wellbore penetrating a subterranean formation during operations comprising drilling, servicing, or producing wells employing fluids introduced into the wellbore to facilitate said operations, said method comprising monitoring on a real-time basis the interaction of said fluids on said formation, wherein said monitoring comprises taking real-time measurements of properties of the formation and using same in a wellbore stability model, and using results from said wellbore stability model in making adjustments in the properties of said fluids to maintain or enhance the strength of said formation in contact with said fluids.

13. The method of claim 12 employing results from at least one pore pressure versus time laboratory test in the wellbore stability model.

14. A method for real-time monitoring the interaction of a subterranean formation with fluids injected into or circulating in a wellbore penetrating said formation for real-time monitoring of the stability of said formation while recovering hydrocarbons from said formation, said method comprising:

constructing an earth-model of the formation adjacent or near the wellbore;

predicting suitable fluids for use in said wellbore;

conducting laboratory experiments to ascertain time-dependent formation behavior in the presence of said predicted suitable fluids;

measuring rock properties in said experiments;

calibrating a wellbore stability model based on said measured rock properties;

injecting or circulating said fluids in said wellbore;

measuring real-time static and dynamic rock properties while said fluids are in said wellbore;

updating said wellbore stability model with said real-time measurements;

adjusting the properties of said fluids as needed to maintain wellbore stability according to said model;

repeating said real-time measuring of rock properties and said updating of the wellbore stability model during said injection or circulating of said fluids in said wellbore enough times that the interaction of said subterranean formation with said fluids may be monitored on a real-time basis such that the formation stability may be monitored on a real-time basis.

* * * * *